(12) United States Patent
Weng et al.

(10) Patent No.: US 12,482,715 B2
(45) Date of Patent: Nov. 25, 2025

(54) CHIP PACKAGE WITH CORE EMBEDDED INTEGRATED PASSIVE DEVICE

(71) Applicant: XILINX, INC., San Jose, CA (US)

(72) Inventors: Li-Sheng Weng, San Diego, CA (US); Alexander Helmut Pfeiffenberger, Toronto (CA)

(73) Assignee: XILINX, INC., San Jose, CA (US)

(*) Notice: Subject to any disclaimer, the term of this patent is extended or adjusted under 35 U.S.C. 154(b) by 439 days.

(21) Appl. No.: 18/070,380

(22) Filed: Nov. 28, 2022

(65) Prior Publication Data
US 2024/0178087 A1 May 30, 2024

(51) Int. Cl.
  *H01L 23/31*    (2006.01)
  *H01L 25/00*    (2006.01)
  *H01L 25/16*    (2023.01)

(52) U.S. Cl.
  CPC ...... *H01L 23/3114* (2013.01); *H01L 23/3128* (2013.01); *H01L 25/162* (2013.01); *H01L 25/50* (2013.01)

(58) Field of Classification Search
  CPC .............. H01L 23/3114; H01L 23/3128; H01L 25/162; H01L 25/50
  See application file for complete search history.

(56) References Cited

U.S. PATENT DOCUMENTS

| | | | | |
|---|---|---|---|---|
| 8,143,987 B2* | 3/2012 | Kireev | ................ | H01L 23/5227 336/200 |
| 8,592,943 B2* | 11/2013 | Wu | ........................ | H10D 84/00 336/200 |
| 8,823,133 B2 | 9/2014 | Jenkins et al. | | |
| 8,860,180 B2* | 10/2014 | Jing | .................... | H01F 17/0013 336/200 |
| 9,330,823 B1* | 5/2016 | Rahman | ............ | H01L 23/49822 |
| 9,365,387 B2 | 6/2016 | Beers et al. | | |

(Continued)

FOREIGN PATENT DOCUMENTS

| | | | | |
|---|---|---|---|---|
| CN | 100381026 C | * | 4/2008 | ............. H01G 4/228 |
| CN | 102088013 B | * | 10/2012 | |

(Continued)

OTHER PUBLICATIONS

U.S. Appl. No. 17/860,223, filed Feb. 24, 2022.

(Continued)

*Primary Examiner* — Laura M Menz
(74) *Attorney, Agent, or Firm* — Patterson + Sheridan, LLP

(57) ABSTRACT

Chip packages are described herein that includes integrated passive devices embedded in a core of a substrate of the chip package, such as a package substrate or an interposer, that shield routings coupled to inductors from adjacent through-substrate conductive paths (e.g., vias). In one example, a chip package includes an integrated circuit (IC) die mounted to a substrate. A core of the substrate has a plurality of inductor routing vias, a plurality of signal transmission vias, and a plurality of ground and power routing vias. A first integrated passive device (IPD) is disposed in the core and separates at least one of the plurality of inductor routing vias from an adjacent via, the adjacent via being one of the plurality of signal transmission vias or one of the plurality of ground and power routing vias.

20 Claims, 6 Drawing Sheets

(56) References Cited

U.S. PATENT DOCUMENTS

| | | | |
|---|---|---|---|
| 9,406,738 B2 | 8/2016 | Kireev et al. | |
| 10,085,342 B2* | 9/2018 | Cheah | H01F 41/046 |
| 10,163,557 B2 | 12/2018 | Lambert et al. | |
| 10,321,577 B2* | 6/2019 | Shang | H05K 3/188 |
| 10,615,133 B2* | 4/2020 | Kamgaing | H01L 25/50 |
| 11,043,470 B2* | 6/2021 | Jing | H01L 25/0652 |
| 11,362,411 B2* | 6/2022 | Haridas | H01Q 3/26 |
| 11,569,156 B2* | 1/2023 | Huang | H01L 23/5385 |
| 11,640,929 B2* | 5/2023 | Neal | H01L 23/49838 |
| | | | 257/774 |
| 12,136,613 B2* | 11/2024 | Weng | H01L 23/50 |
| 12,218,036 B2* | 2/2025 | Murugan | H01L 24/17 |
| 2012/0217547 A1 | 8/2012 | Ando et al. | |
| 2015/0235990 A1* | 8/2015 | Cheng | H01L 23/13 |
| | | | 257/773 |
| 2015/0244410 A1* | 8/2015 | Leong | H04B 1/00 |
| | | | 455/73 |
| 2017/0084541 A1* | 3/2017 | Hsu | H01L 21/4853 |
| 2017/0170155 A1* | 6/2017 | Yu | H01L 24/20 |
| 2017/0338183 A1* | 11/2017 | Hsu | H01L 23/145 |
| 2018/0168043 A1* | 6/2018 | Cheah | H01L 21/4857 |
| 2019/0051609 A1* | 2/2019 | Hsu | H01L 23/49827 |
| 2019/0244883 A1* | 8/2019 | Ong | H05K 3/3405 |
| 2019/0304887 A1* | 10/2019 | Ganesan | H01L 23/66 |
| 2019/0372199 A1* | 12/2019 | Haridas | H01Q 3/30 |
| 2020/0203256 A1* | 6/2020 | Neal | H01L 23/49827 |
| 2020/0381365 A1* | 12/2020 | Hsu | H01L 21/4853 |
| 2021/0242134 A1* | 8/2021 | Yamanishi | H01L 23/053 |
| 2021/0296248 A1* | 9/2021 | Khim | H01L 21/565 |
| 2022/0028805 A1* | 1/2022 | We | H01L 24/16 |
| 2022/0059476 A1* | 2/2022 | Collins | H01L 21/4857 |
| 2022/0077108 A1* | 3/2022 | Wu | H01L 21/561 |
| 2022/0189934 A1* | 6/2022 | Kim | H01L 23/5384 |
| 2022/0271416 A1* | 8/2022 | Haridas | H01Q 1/2283 |
| 2022/0301978 A1* | 9/2022 | Gleichauf | H01L 23/467 |
| 2022/0302003 A1* | 9/2022 | Pan | H01L 23/5385 |
| 2022/0344249 A1* | 10/2022 | Xie | H01L 25/16 |
| 2022/0352084 A1* | 11/2022 | Hsu | H01L 23/3114 |
| 2022/0415815 A1* | 12/2022 | Waidhas | H01L 25/18 |
| 2023/0253380 A1* | 8/2023 | Weng | H01L 24/24 |
| | | | 257/774 |
| 2023/0268306 A1* | 8/2023 | Jing | H01L 23/49833 |
| | | | 257/786 |
| 2023/0335510 A1* | 10/2023 | Chiu | H01L 23/49838 |
| 2023/0396218 A1* | 12/2023 | Wang | H03F 1/0288 |
| 2024/0055359 A1* | 2/2024 | Weng | H01L 23/49816 |
| 2024/0071958 A1* | 2/2024 | Shi | H01L 23/645 |
| 2024/0178087 A1* | 5/2024 | Weng | H01L 23/3114 |
| 2024/0234304 A1* | 7/2024 | Kulkarni | H01L 23/49822 |
| 2024/0312957 A1* | 9/2024 | DeLaCruz | H01F 17/06 |
| 2024/0355749 A1* | 10/2024 | Ecton | H01L 23/49816 |
| 2025/0079328 A1* | 3/2025 | Kulkarni | H01L 21/568 |
| 2025/0096089 A1* | 3/2025 | Spurney | H01L 23/49822 |

FOREIGN PATENT DOCUMENTS

| | | | | |
|---|---|---|---|---|
| CN | 111128906 B | * | 5/2024 | H01L 23/3114 |
| DE | 102015119892 A1 | * | 6/2016 | H01L 23/5227 |
| DE | 102016116088 A1 | * | 6/2017 | H01L 24/24 |
| EP | 3198738 B1 | * | 6/2023 | H04B 3/00 |
| GB | 2097598 A | * | 11/1982 | H02K 39/00 |
| GB | 2604294 A | * | 8/2022 | H01Q 3/36 |
| JP | 2007335764 A | * | 12/2007 | |
| JP | 2019205122 A | * | 11/2019 | H01L 24/32 |
| KR | 101793967 B1 | * | 11/2017 | H01L 25/0657 |
| KR | 20240055359 A | * | 4/2024 | B66B 1/3461 |
| KR | 102672233 B1 | * | 6/2024 | H01Q 9/0407 |
| WO | WO-2018093379 A1 | * | 5/2018 | H05K 1/117 |
| WO | WO-2018115896 A2 | * | 6/2018 | H01Q 23/00 |
| WO | WO-2022060515 A1 | * | 3/2022 | H01L 25/0652 |
| WO | WO-2022271241 A1 | * | 12/2022 | H01L 24/97 |
| WO | WO-2024148121 A1 | * | 7/2024 | H01L 23/3128 |
| WO | WO-2025033238 A1 | * | 2/2025 | H01G 9/048 |

OTHER PUBLICATIONS

U.S. Appl. No. 17/896,972, filed Aug. 26, 2022.

U.S. Appl. No. 19/065,838, filed Feb. 27, 2025 Entitled "Structure and Method for Embedding a Plurality of Devices and Components Into a Thick Substrate Core".

U.S. Appl. No. 18/619,090, filed Mar. 27, 2024 Entitled "Integrated Circuit Package Device With a Power Delivery Substrate".

* cited by examiner

CHIP PACKAGE WITH CORE EMBEDDED INTEGRATED PASSIVE DEVICE

TECHNICAL FIELD

Embodiments of the present invention generally relate to a chip package having integrated passive devices embedded in a core of a substrate, and in particular, to a chip package having integrated passive devices embedded in a core of a substrate of the chip package, such as a package substrate or an interposer, that shield routings coupled to inductors from adjacent through-substrate conductive paths.

BACKGROUND

Electronic devices, such as tablets, computers, copiers, digital cameras, smart phones, control systems, automated teller machines, data centers, artificial intelligence system, and machine learning systems among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies are mounted to a top side (i.e., top surface) of the package substrate while a bottom side (i.e., bottom surface) of the package substrate is mounted to a printed circuit board (PCB). The IC dies may include memory, logic or other IC devices.

Inductors are often used in chip packages that include integrated voltage regulator systems. As technology continues to evolve, the density of routings passing though vias formed through-substrate cores continues to increase. However, vias cannot be placed too close to vias coupled to inductors because of increased noise and parasitic effects, which limits the density of conductive vias through a given area of the substrate.

Therefore, a need exists for a chip package with an improved substrate design.

SUMMARY

Chip packages are described herein that includes integrated passive devices embedded in a core of a substrate of the chip package, such as a package substrate or an interposer, that shield routings coupled to inductors from adjacent through-substrate conductive paths (e.g., vias). In one example, a chip package includes an integrated circuit (IC) die having functional circuitry and a substrate having the IC die mounted thereon. The substrate includes upper build-up layers disposed on a core. The core has a plurality of inductor routing vias, a plurality of signal transmission vias, and a plurality of ground and power routing vias. The build-up layers includes circuitry coupling the inductor routing vias, the signal transmission vias, and the ground and power routing vias to the functional circuitry of the IC die. A first integrated passive device (IPD) is disposed in the core and separates at least one of the plurality of inductor routing vias from an adjacent via, the adjacent via being one of the plurality of signal transmission vias or one of the plurality of ground and power routing vias.

In another example, a chip package is provided includes an integrated circuit (IC) die having functional circuitry and a substrate having the IC die mounted thereon. The functional circuitry includes voltage regulator circuitry. The substrate includes upper build-up layers disposed on a core. The core has a plurality of inductor routing vias, a plurality of signal transmission vias, and a plurality of ground and power routing vias. The build-up layers includes circuitry coupling the inductor routing vias, the signal transmission vias, and the ground and power routing vias to the functional circuitry of the IC die. A first integrated passive device (IPD) is disposed in the core adjacent least a first inductor routing via of the plurality of inductor routing vias. A second IPD is disposed in the core in the core adjacent least a second inductor routing via of the plurality of inductor routing vias. At least one of the first or second IPD separates at least one of the first or second inductor routing vias from an adjacent via. The adjacent via being one of the plurality of signal transmission vias or one of the plurality of ground and power routing vias.

In another example, a chip package is provided includes an integrated circuit (IC) die having functional circuitry and a substrate having the IC die mounted thereon. The functional circuitry includes voltage regulator circuitry. The substrate includes upper build-up layers disposed on a core. The core has a plurality of inductor routing vias, a plurality of signal transmission vias, and a plurality of ground and power routing vias. The build-up layers includes circuitry coupling the inductor routing vias, the signal transmission vias, and the ground and power routing vias to the functional circuitry of the IC die. A first integrated passive device (IPD) is disposed in the core adjacent least a first inductor routing via of the plurality of inductor routing vias. A second IPD is disposed in the core in the core adjacent least a second inductor routing via of the plurality of inductor routing vias. At least one of the first or second IPD separates at least one of the first or second inductor routing vias from an adjacent via. The adjacent via being one of the plurality of signal transmission vias or one of the plurality of ground and power routing vias. An air core inductor is formed in the core of the substrate and coupled to the voltage regulator circuitry. The air core inductor is formed in part by the first and second inductor routing vias. A first integrated passive device (IPD) is configured as a capacitor and disposed in the core. A second IPD is configured as a capacitor and is disposed in the core. At least one of the first and second IPD is coupled to the air core inductor and separating at least one of the first and second inductor routing vias from an adjacent via. The adjacent via being one of the plurality of signal transmission vias.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package and method for fabricating the same are provided that includes integrated passive devices embedded in a core of a substrate of the chip package, such as a package substrate or an interposer, that shield routings coupled to inductors from adjacent through-substrate conductive paths (e.g., vias). The embedded integrated passive devices, particularly in the form of capacitors, function to shield adjacent conductors passing through the core of the substrate. When used to shield vias coupled to inductors, the "keep-out" space need around inductor-coupled vias may be reduced, enabling a beneficial increase in via density of the substrate. Moreover, embedded integrated passive capacitors may also be coupled to the inductor-coupled vias used for package integrated voltage-regular systems, thus supplementing the capacitance and improving device performance, while also reducing the area needed to route power through the substrate. The substrate may be a package substrate or an interposer. The use of core embedded capacitors and inductors additionally opens up extra room for power routing, achieves larger inductances within a small footprint, achieves high Q-value for high performance designs, frees up more thick metal layers on the top die for fabric power delivery network (PDN) to reduce ohmic loss.

Figure 1:
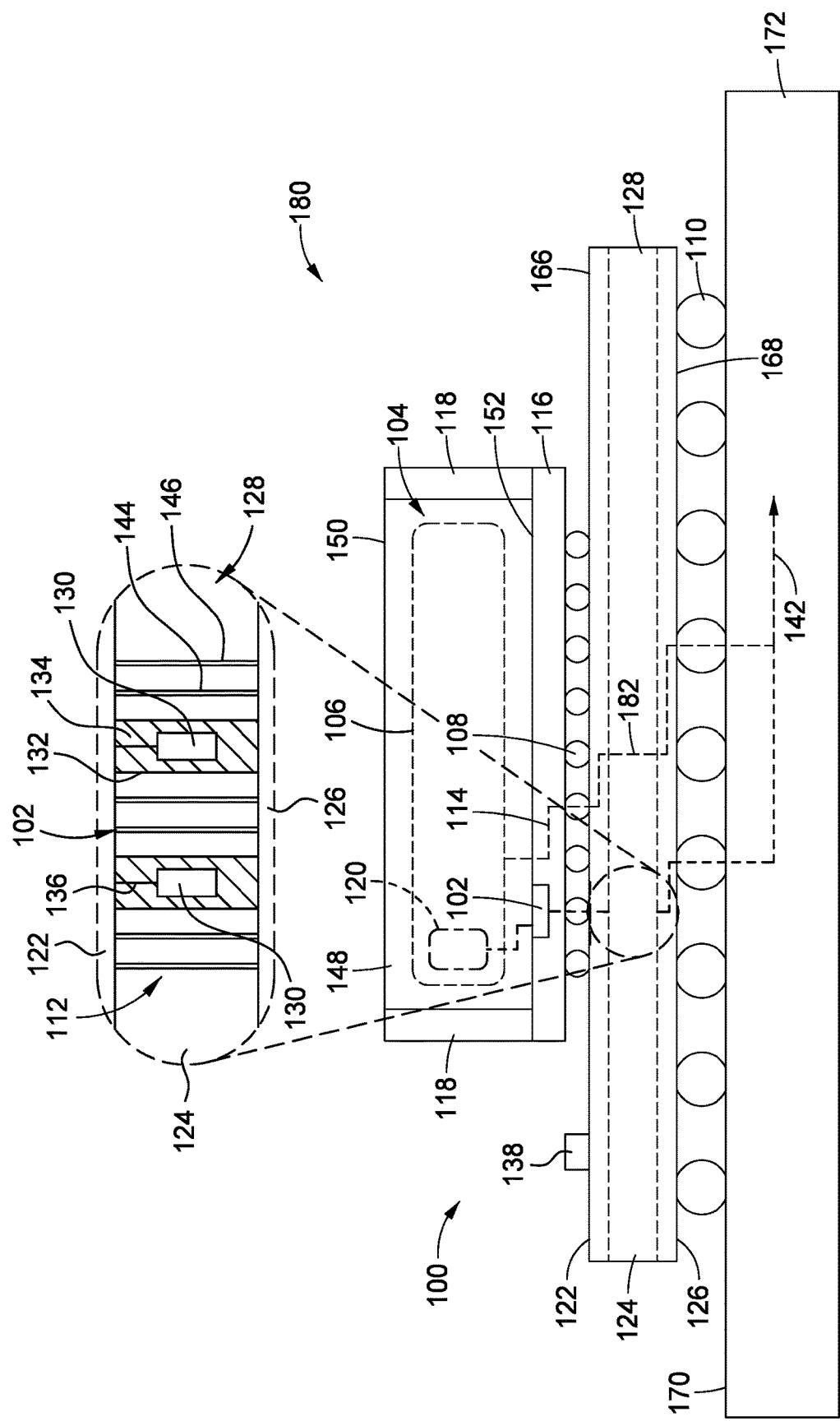
FIG. 1 is a schematic sectional view of one example of chip package having an integrated passive device disposed in a core of a substrate and separating inductor connected vias within the core from at least one via used for ground, power or data transmission.

Turning now to FIG. 1, a schematic sectional view of a chip package 100 is illustrated having two off-die inductors 102, 112 having routing separated from other conductors within a substrate of the chip package 100 by at least one integrated passive device 130. The chip package 100 includes at least one integrated circuit (IC) die 104, an optional redistribution layer (RDL) 116 and at least one substrate. The substrate may be a package substrate 128 as illustrated in FIG. 1, or an interposer 190 mounted to a package substrate 128 as illustrated in and later discussed with reference to FIG. 1A. Continuing to refer to FIG. 1, the RDL 116 is formed on the lower surface of the IC die 104. The opposite side of the RDL 116 is coupled to the package substrate 128. The package substrate 128 of the chip package 100 may be mounted on a printed circuit board (PCB) 172 to form an electronic device 180.

A plurality of off-die inductors (e.g., first and second inductors) 102, 112 are formed in the package substrate 128. Although in FIG. 1 only two inductors 102, 112 are shown, as many off-die inductors may be utilized as desired and as space permits. Additionally, the off-die inductors 102, 112 may be disposed in other locations, where only the routing of the inductors are embedded in the substrate (i.e., such as through the vias of the core of the substrate).

The first inductor 102 is coupled to functional circuitry 106 of the IC die 104, rather than being formed within the IC die 104 or located on exterior of the package substrate 128 or other location within the chip package 100, such as a surface mounted inductor. Thus, the first inductor 102 is disposed very close to the IC die 104 and thus requires simple and short routings with the RDL 116, which enables excellent performance. Additionally, as the first inductor 102 is not formed within the IC die 104, space normally occupied by on-die inductors is now free within the IC die 104 for additional IC device, improved power routing, and the like. The second inductor 112 is similarly configured.

The integrated passive device 130 is disposed in a recess 132 formed in the substrate of the chip package 100 between portions of, or routings coupled to, the inductors 102, 112 that are disposed in the substrate 128. Additionally or in the alternative, the integrated passive device 130 is disposed in the substrate of the chip package 100 between portions of, or routings coupled to, one of the inductors 102, 112 and adjacent vias 144, 146 formed through the substrate 128. The vias 144, 146 are configured to transmit at least one of power, ground, or data signals through the substrate 128 of the chip package 100.

The integrated passive device 130 may be secured in the recess 132 by a dielectric filler 134. The dielectric filler 134 may be an epoxy, potting compound or other suitable adhesive. The recess 132 may be formed in the substrate by drilling, etching, laser or other suitable technique.

The integrated passive device 130 is generally a preformed integrated circuit element. The integrated passive device 130 may be a resistor, capacitor, inductor, a balun and the like. The integrated passive device 130 is generally by routing 136 to the functional circuitry 106 of the IC die 104, or other routing within the chip package 100.

In the example depicted in FIG. 1, the integrated passive device 130 is a capacitor. The integrated passive device 130 configured as a capacitor provides an excellent shield that effectively reduces noise generated by current passing through portions of the inductors 102, 112 that are disposed in the substrate from reaching the vias 144, 146 formed through the substrate 128 adjacent the inductors 102, 112. In this manner, the inductor routings passing through the substrate 128 may be much closer to signal carrying vias 144, 146 than as would be allowed in conventions designs. The resulting higher substrate via density improves performance advantageously without degrading signal integrity.

When the integrated passive device 130 is configured as a capacitor, the routing 138 of integrated passive device 130 may be coupled to a voltage regulator circuitry 120 formed in the IC die 104. However, the integrated passive device 130 may be coupled to other circuitries of the chip package 100. An exemplary wiring schematic including the integrated passive device 130 is provided with reference to FIG. 3 and described in further detail below after a brief description of the other components of the chip package 100.

Continuing to refer to FIG. 1, the IC die 104 of the chip package 100 includes functional circuitry 106. The functional circuitry 106 may include block random access memory (BRAM), UltraRAM (URAM), digital signal processing (DSP) blocks, configurable logic elements (CLEs), and the like. The IC die 104 may be, but is not limited to, programmable logic devices, such as field programmable gate arrays (FPGA), memory devices, such as high bandwidth memory (HBM), optical devices, processors or other IC logic structures. The IC die 104 may optionally include optical devices such as photo-detectors, lasers, optical sources, and the like. In the example of FIG. 1, the IC die 104 is a logic die having math processor (also known as math engine) circuitry for accelerating machine-learning math operations in hardware, such as self-driving cars, artificial intelligence and data-center neural-network applications.

Optionally, the at least one IC die 104 may be a plurality of IC dies 104. When a plurality of IC dies 104 are utilized, the IC dies 104 may be disposed in a vertical stack and/or disposed laterally side by side. It is contemplated that the IC dies 104 comprising the plurality of IC dies 104 may be the same or different types. Although only one IC die 104 is shown in FIG. 1, the number of IC dies 104 disposed in the chip package 100 may vary from one to as many as can fit within the chip package 100. Additionally, one or more of the IC dies 104 may optionally be configured as a chiplet.

The IC die 104 includes a die body 148 having a die bottom surface 152 and a die top surface 150. The functional circuitry 106 is disposed within the die body and includes routing that terminates on the die bottom surface 152 of the IC die 104, for example at contact pads (later shown in FIG. 2). In the example depicted in FIG. 1, the functional circuitry 106 includes voltage regulator circuitry 120 to which the off-die inductors 102, 112 are connected. Alternatively, the inductors 102, 112 may be coupled to other types of circuitry.

The RDL 116 is formed on the contact pads exposed on the die bottom surface 152 of the IC die 104. The RDL 116 includes routing formed from a plurality of patterned metal layers disposed between a plurality of dielectric layers. The patterned metal layers are coupled by vias to form interconnect circuitry 114 of the RDL 116. A portion of the interconnect circuitry 114 include the first inductor 102. Thus, the portion of the interconnect circuitry 114 connects the functional circuitry 106 of the IC die 104 to package circuitry 182 formed in the package substrate 128 through the first inductor 102. In the example depicted in FIG. 1, the interconnect circuitry 114 of the RDL 116 is electrically and mechanically coupled to the package circuitry 182 formed in the package substrate 128 by interconnects 108. In one example, the interconnects 108 are solder connections, such as solder bumps. The interconnects 108 may alternatively be formed by a hybrid bond layer or other suitable technique.

In some examples such as depicted in FIG. 1, the RDL 116 is wider than the IC die 104 to accommodate a fan out using interconnect circuitry 114 of the RDL 116. When the RDL 116 is wider than the IC die 104, a mold compound 118 surrounding the lateral sides of the IC die 104 may be utilized to provide structural support for portions of the RDL 116 that extend beyond the sides of the IC die 104.

Figure 2:
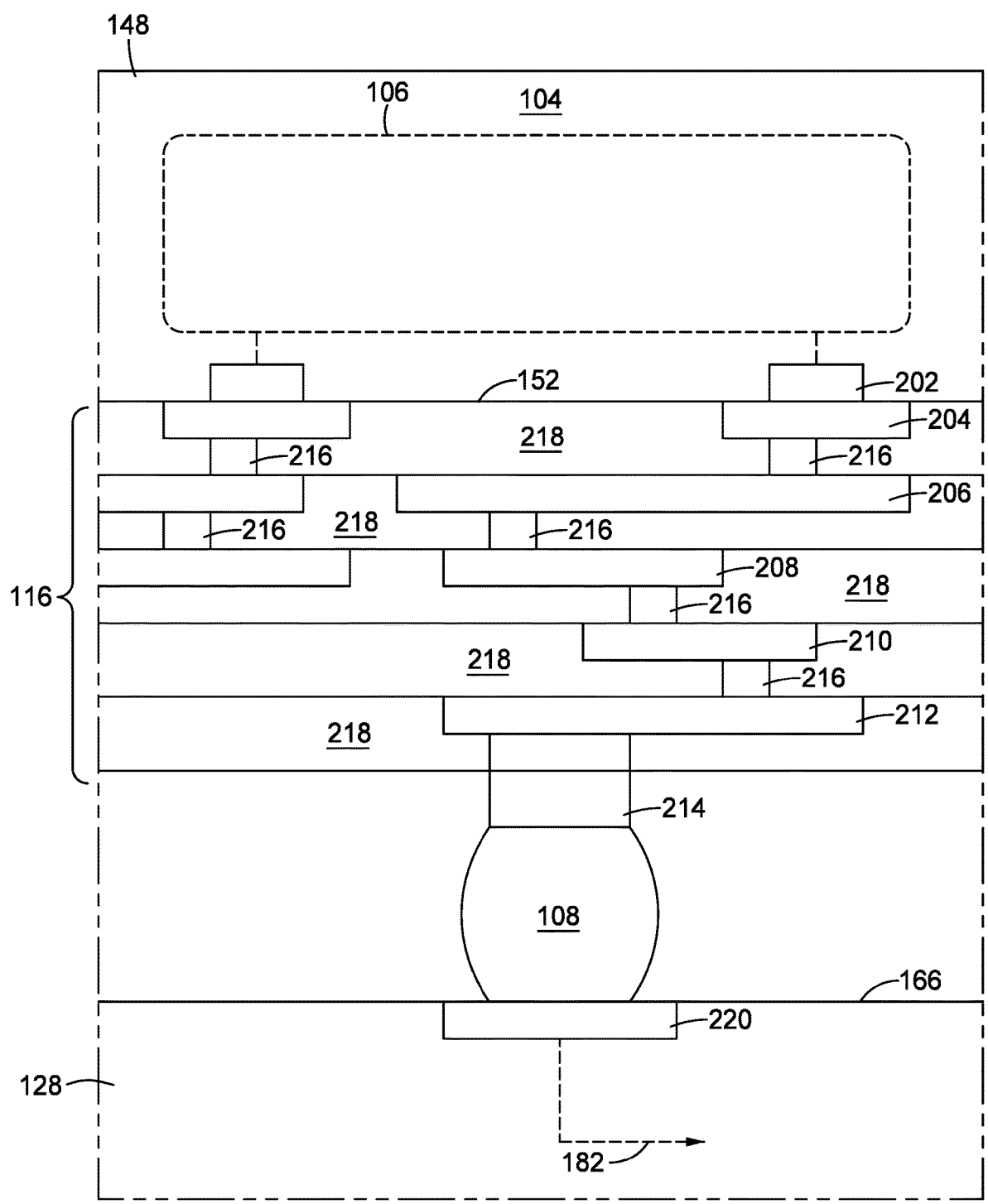
FIG. 2 is a schematic sectional view of a portion of the chip package illustrating one example of the connections between an integrated circuit (IC) die and a package substrate through a redistribution layer (RDL).

FIG. 2 is a schematic sectional view of a portion of the chip package 100 illustrating one example of the connections between the IC die 104 and the package substrate 128 through the optional RDL 116. When the RDL 116 is not present, the IC die 104 is directly mounted to the package substrate 128 through solder connections or a hybrid bonding interface.

The RDL 116 includes a plurality of conductive layers and vias 216 which are patterned to form the RDL circuitry 114. There can be between two to seven patterned conductive layers forming the RDL circuitry 114. In the example of FIG. 2, five conductive layers 204, 206, 208, 210, 212 are shown, although a different number of conductive layers may be utilized. The conductive layers 204, 206, 208, 210, 212 are patterned to form lines that are connected by vias 216 to form the RDL circuitry 114. The patterned conductive layers 204, 206, 208, 210, 212 are separated by dielectric layers 218.

The one end of the routings comprising the RDL circuitry 114 terminates at the first conductive layer 204. The routing terminations of RDL circuitry 114 at the first conductive layer 204 are coupled to contact pads 202 formed on the bottom surface 152 of the IC die 104. The other end of the routings comprising the RDL circuitry 114 terminates at the last conductive layer 212. The routing terminations of RDL circuitry 114 at the last conductive layer 212 are coupled to an under-bump layer 214 upon which the interconnect 108 is formed. The interconnect 108 couples the RDL circuitry 114 to a bond pad formed on a top surface 166 of the package substrate 128, thus connecting the RDL circuitry 114 to the package circuitry 182 of the package substrate 128.

Returning back to FIG. 1, the package substrate 128 generally includes an upper build-up layer 122, a core 124 and a lower build-up layer 126. The lower build-up layer 126 is disposed on the other side of the core 124 from the upper build-up layer 122. The upper build-up layer 122 includes a plurality of conductive layers and vias that are patterned to provide routing of a portion of the package circuitry 182. One end of the package circuitry 182 formed in the upper build-up layer 122 terminates at the bond pad formed on the top surface 166 of the package substrate 128 where the package circuitry 182 connects to the interconnect circuitry 114 of the RDL 116. The other end of the package circuitry 182 formed in the upper build-up layer terminates at vias formed through the core 124. The lower build-up layer 126 may be fabricated similar to the upper build-up layer 122. At least one of the upper and lower build-up layers 122, 126 includes a fan out in the circuitry 114 of the package substrate 128.

In examples where the package substrate 128 does not include a lower build-up layer 126, the vias formed through the core 124 of the package circuitry 182 may be connected by solder balls 110 to circuitry 142 of the PCB 172 that terminates at a PCB top surface 170 of the PCB 172. In examples having a lower build-up layer 126, the vias formed through the core 124 are coupled through the patterned conductive layers and vias of the lower build-up layer 126 such that the package circuitry 182 terminates at a package bottom surface 168. At the package bottom surface 168, the package circuitry 182 is coupled to the circuitry 142 of the PCB 136 by the solder balls 140 (or alternatively via a socket).

Although the second inductor 112 is shown disposed in the package substrate 128 in FIG. 1, the second inductor 112 may alternatively or additionally be located in other portions of the chip package 100 illustrated in FIG. 1, or other chip packages having alternative configurations. For example, the second inductor 112 may be formed in an interposer 190, as depicted in FIG. 1A.

Figure 1A:
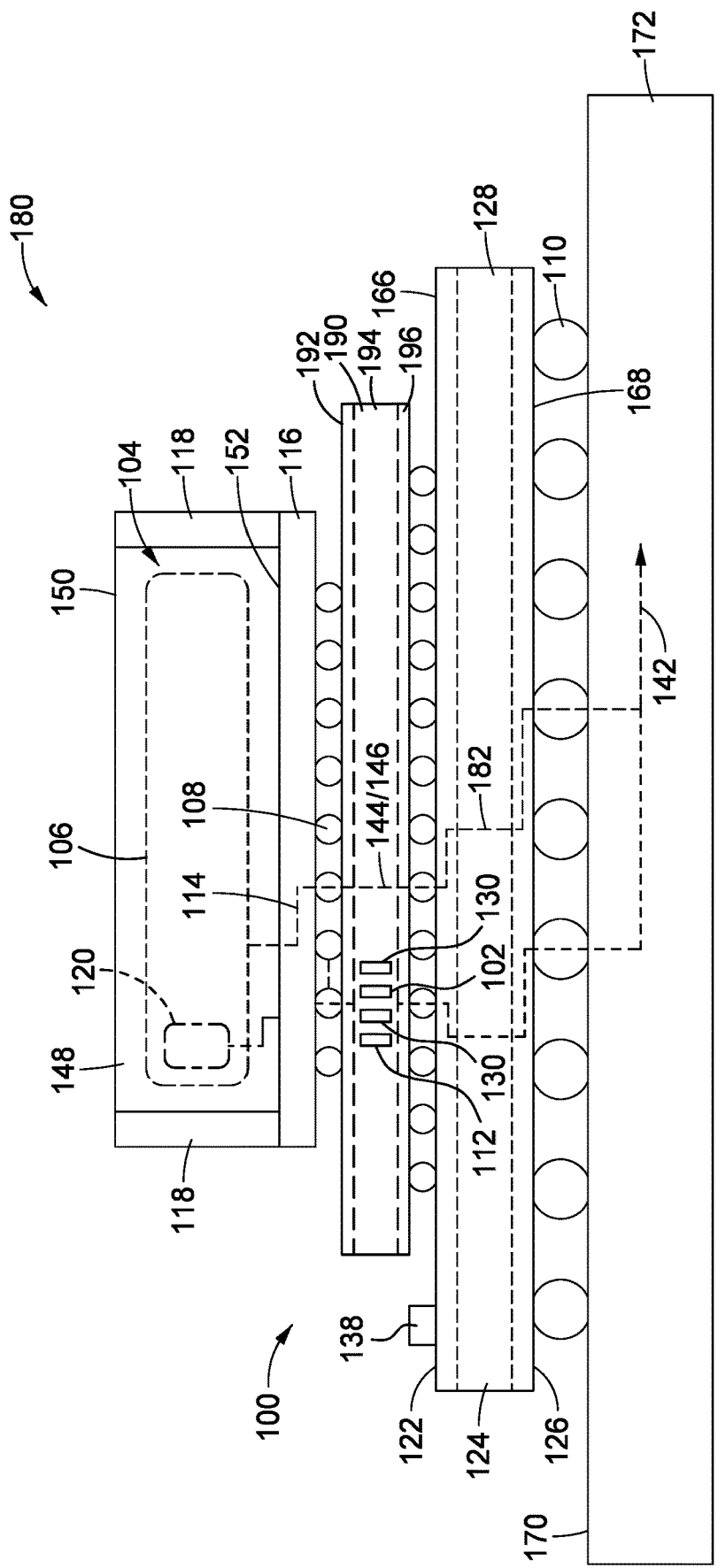
FIG. 1A is a schematic sectional view of another example of chip package having an integrated passive device disposed in a core of a substrate and separating inductor connected vias within the core from at least one via used for ground, power or data transmission.

In FIG. 1A, the interposer 190 is shown disposed between the package substrate 128 and the IC die 104. Similar to the package substrate 128, the interposer 190 may include upper-build up layers 192, a core 194 and lower built-up layers 196. In one example, the second inductor 112 may be an air core inductor disposed in the interposer 190 and formed using vias passing through the core 194.

Additionally, although the first inductor 102 is shown disposed embedded in the core 124 of the substrate 128 in FIG. 1, the first inductor 102 may alternatively or additionally be located in other portions of the chip package 100 illustrate in FIG. 1, or other chip packages having alternative configurations. For example, the first inductor 102 may be formed in any one of the build-up layers 122, 126, 192, 196. In other examples, the first inductor 102 may be at least partially formed in one of the cores 124, 194.

Returning to the primary example depicted in FIG. 1, a capacitor 138 is also present in the chip package 100 in a location remote from the IC die 104. In one example, the capacitor 138 is surface mounted to the package substrate 128 and is electrically coupled to the voltage regulator circuitry 120 disposed in the IC die 104. For example, the capacitor 138 may be a decoupling capacitor. The capacitor 138 generally has a capacitance that is order of magnitude greater than a capacitance of the integrated passive device 130. For example, the capacitance of the capacitor 138 may be 2 times greater, such as 50 or more times greater, than a capacitance of the integrated passive device 130.

The off-die inductors 102, 112 are disposed in the package substrate 128 or another off-die location within the chip package 100. The second inductor 112 may be disposed in a cavity formed in the core 124 of the package substrate 128, formed from the lines and vias forming the circuitry 114 of the package substrate 128 or located in another off-die location within the chip package 100. The second inductor 112 generally configured the same as the first inductor 102. In one example, one or both of the off-die inductors 102, 112 are air core inductors.

Figure 3:
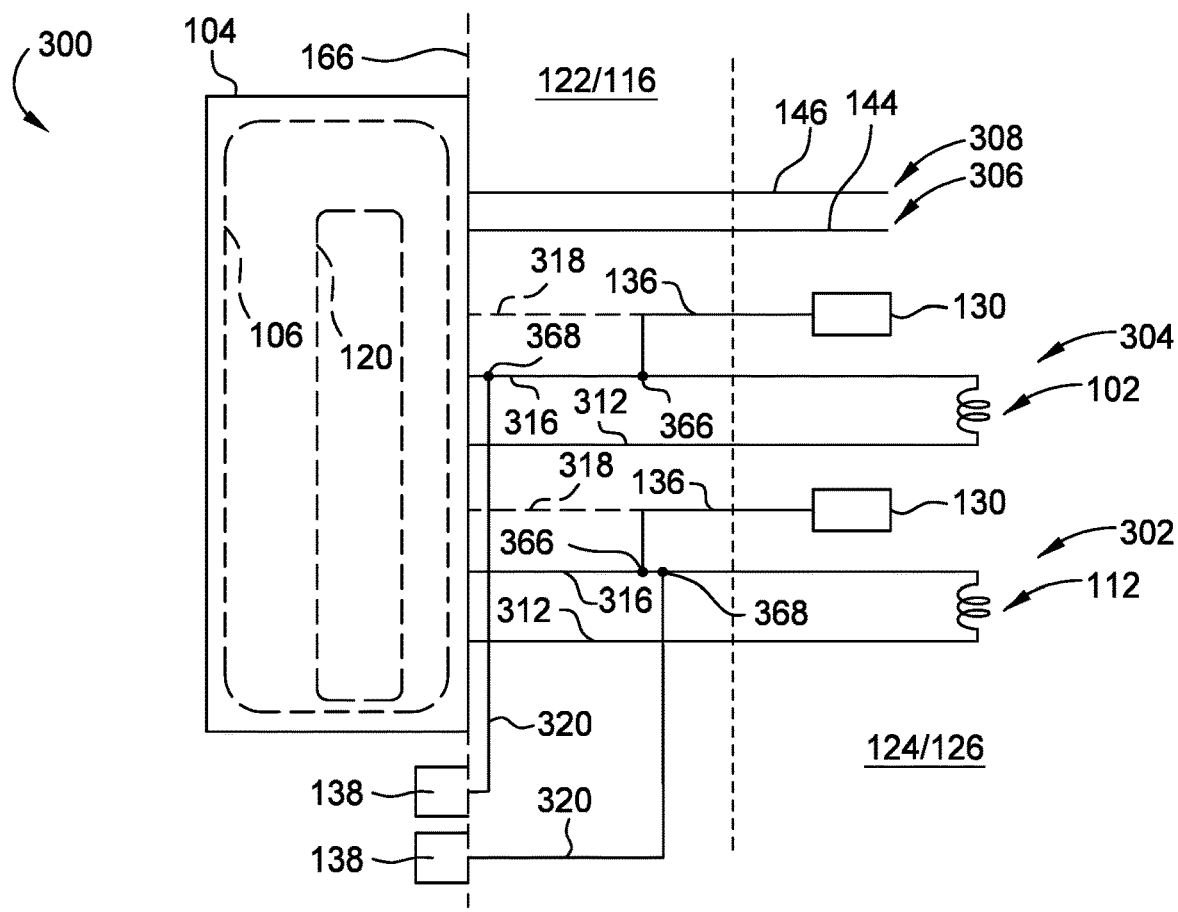
FIG. 3 is a schematic circuit diagram of signal paths through a substrate of the chip package depicted in FIG. 1, the substrate having embedded integrated passive devices separating at least two vias.

FIG. 3 is a circuit schematic 300 illustrating a chip package having integrated passive device 130 disposed in a substrate (such as a package substrate 128 or interposer 190) adjacent at least one routing that is coupled to an off-die inductors (such as the off-die inductors 102, 112 discussed above). The circuit schematic 300 is representative of, as but not limited to, the chip package 100. In the circuit schematic 300 depicted in FIG. 3, there are at least two signal paths 302, 304, which are connected to the inductors 102, 112. For example, a first signal path 302 includes a first inductor 102 embedded in the core 124 of the package substrate 128. Alternatively, the first inductor 102 may be disposed in a second build-up layer 126 of the package substrate 128, or another location within the chip package 100. The first signal path 302 as routings 312, 316 that couples the first inductor 102 to the voltage regulator circuitry 120 residing in the functional circuitry 106 of the IC die 104. An integrated passive device 130 is embedded in the core 124 of the substrate 128 and is coupled by routing 136 to a node 366 in the first signal path 302 between the first inductor 102 and the voltage regulator circuitry 120. Optionally, the integrated passive device 130 is not coupled to the first signal path 302, but rather is coupled by routing 318 directly to the functional circuitry 106 of the IC die 104. A decoupling capacitor 138 is coupled by routing 320 to a node 368 in the first signal path 302 also in the routing 316 between the first inductor 102 and the voltage regulator circuitry 120. The decoupling capacitor 138 may be surface mounted to the top surface 166 of the package substrate 128, or in another suitable location. The capacitance of the decoupling capacitor 138 generally has a capacitance that is much larger, for example 10 or more times larger than the capacitance of the integrated passive device 130. The two capacitors (i.e., the integrated passive device 130 and the decoupling capacitor 138) improves the performance of the voltage regulator circuitry 120 without using any space within the chip package 100 that would have been utilized for routing or other electronic device. The nodes 366, 368 may reside in the upper build-up layer 122 of the package substrate 128, or within the IC die 104. Optionally, the one or more of the nodes 366, 368 may reside in the RDL 116, when present.

Optionally, the first signal path 302 may include more than one inductor 102. The additional series-coupled inductor(s) may reside in the RDL 116, in the package substrate 128 (or interposer 190), be surface mounted to the package substrate 128 or be disposed in another location of the chip package 100. The coil comprising the first inductor 102 may optionally be wound in a direction opposite that of the coil comprising a neighboring inductor (such as the second inductor 112 disposed on the second signal path 304). In this manner, the first signal path 302 defined through the first inductor 102 may be configured to transmit signals having a different voltage domains and/or different voltage phases than the second signal path 304 defined through the second inductor 112.

The second signal path 304 is similarly configured to the first signal path 302. One of the integrated passive devices 130 of the first and second signal paths 302, 304 illustrated in FIG. 3 is disposed between the first and second signal paths 302, 304. The presence of the integrated passive device 130 limits cross-talk between the first and second signal paths 302, 304.

Also in the circuit schematic 300 depicted in FIG. 3, there are at least two signal paths 306, 308 that are adjacent the first and second signal paths 302, 304. The signal paths 306, 308 are part of a plurality of signal paths carrying power, ground or data through the package substrate 128 to the functional circuitry 106 of the IC die 104. The third signal path 306 includes routing 146 that has a via formed through the core 124 of the substrate 128. The third signal path 306 is immediately adjacent to the second signal path 304. An integrated passive device 130 is embedded in the core 124 of the substrate 128. The integrated passive device 130 may be coupled to the node 366 in the second signal path 304, or coupled to the functional circuitry 106 without being directly coupled to the second signal path 304.

Similarly, the fourth signal path 308 includes routing 146 that has a via formed through the core 124 of the substrate 128. The fourth signal path 308 is immediately adjacent to the third signal path 306. Although an integrated passive device 130 is not shown embedded in the core 124 of the substrate 128 between the third and fourth signal paths 306, 308, one or more integrated passive devices 130 may be disposed in the core 124 of the substrate 128 between signal paths 306, 308.

The integrated passive device 130 disposed between the second signal path 304 and the immediately adjacent third signal path 306 beneficially reduces the amount of noise generated by the oscillating current in the vias disposed through the core 124 of the substrate 128 of the second signal path 304 that is undesirably transmitted to the adjacent third signal path 306, and even the fourth signal path 308. This is particularly beneficial when the third signal path 306 is utilized to carry data signals or ground signals when parasitic noise promotes performance degradation or reliability issues.

Figure 4:
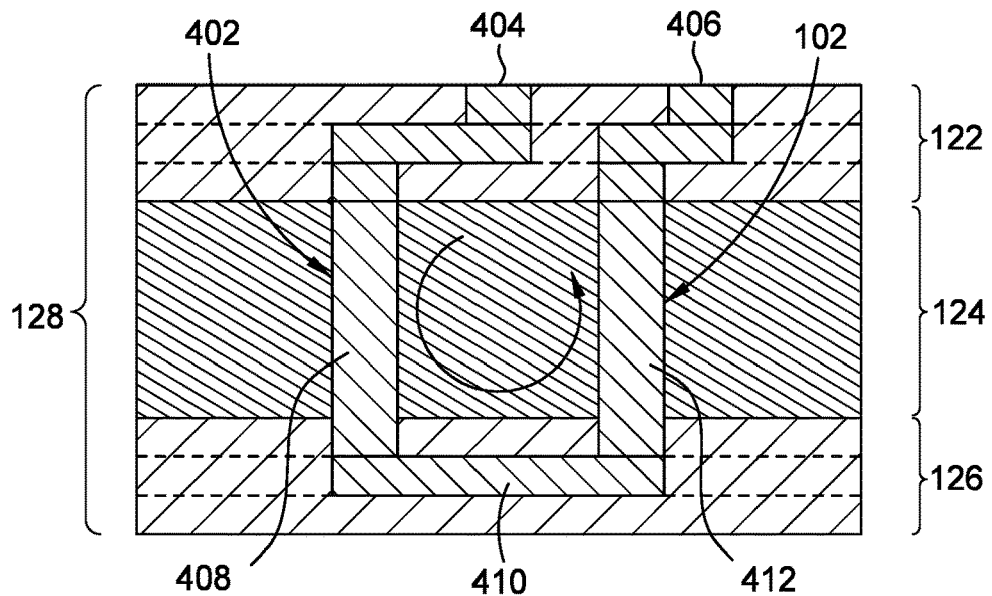
FIG. 4 is a schematic sectional view of an example of an inductor disposed in a core of a substrate, the inductor configured as an air core inductor.

FIG. 4 is one example of the construction of the first inductor 102 as an air coil inductor. The first inductor 102 includes at least one coil 402. Although one coil 402 is shown in FIG. 4, additional coils 402 may be coupled in series to form the first inductors 102. The coil 402, which is part of the first signal path 302 illustrated in FIG. 3, includes an input lead 404, an output lead 406, a first via 408, a jumper 410, and a second via 412. The input lead 404 and the output lead 406 are formed in the upper build-up layer 122 of the package substrate 128. One end of input lead 404 is connected to the functional circuitry 106 of the IC die 104. In one example, the input lead 404 is connected to voltage regulator circuitry 120 residing in the functional circuitry 106 of the IC die 104. In other examples, the input lead 404 may be connected to a different type of circuitry residing in the functional circuitry 106 of the IC die 104. The other end of input lead 404 is connected to the first via 408.

The first and second vias 408, 412 are formed in the core 124 of the package substrate 128. The first and second vias 408, 412 are generally spaced apart in a parallel orientation. The ends of the vias 408, 412 farthest from the IC die 104 are coupled by the jumper 410. The jumper 410 is formed in the lower build-up layer 126 of the package substrate 128, but may alternatively be in a different location.

The end of the second via 412 closest the IC die 104 is connected to the output lead 406. The output lead 406 is connected to the functional circuitry 106 of the IC die 104. In one example, the input lead 404 is connected to voltage regulator circuitry 120 residing in the functional circuitry 106 of the IC die 104. The output lead 406 is also coupled to the nodes 366, 368 illustrated in FIG. 3.

Figure 5A:
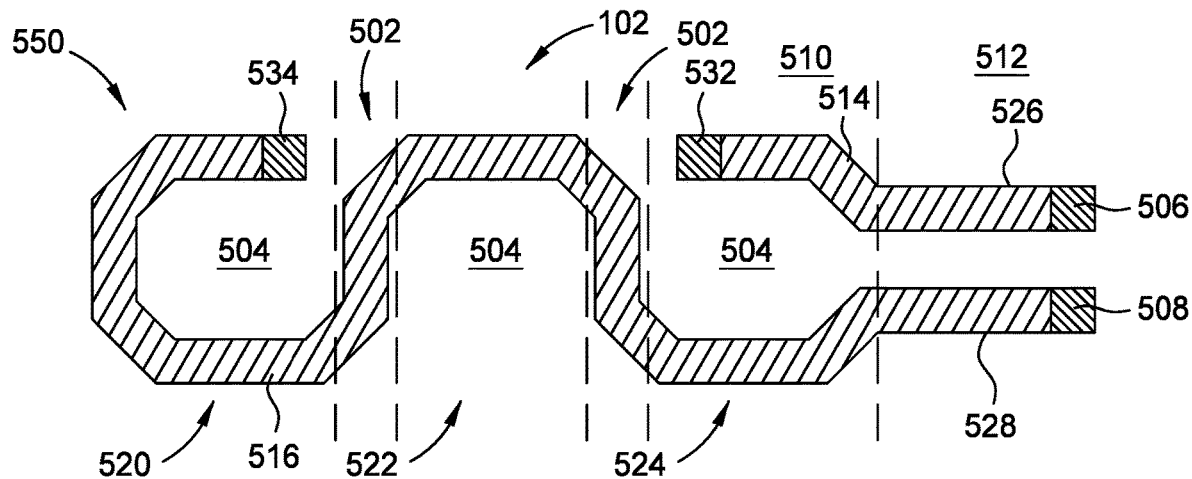
FIGS. 5A-5C are a schematic sectional views of an example of an inductor disposed in a build-up layer of a substrate, the inductor constructed as loops formed in adjacent layers of the build-up layer, one layer of the build-up layer illustrated in each of FIGS. 5A-5C.
Figure 5B:
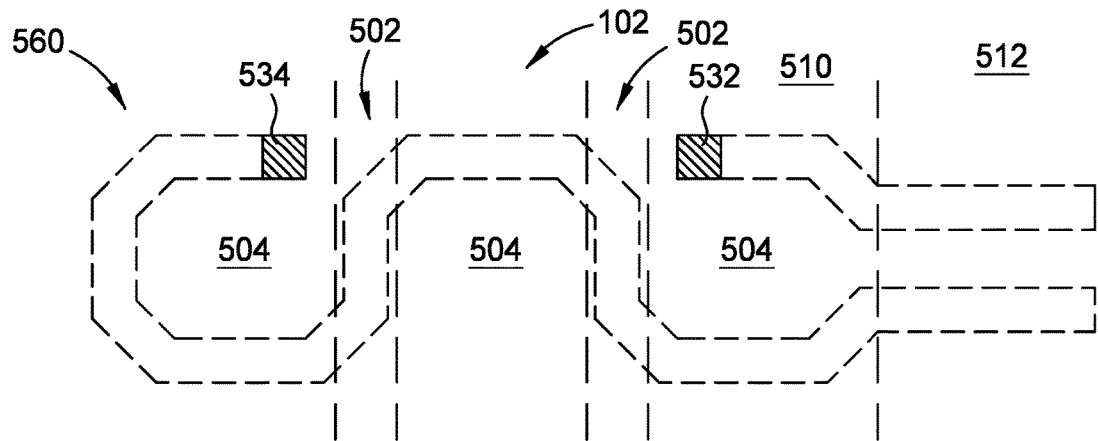
Figure 5C:
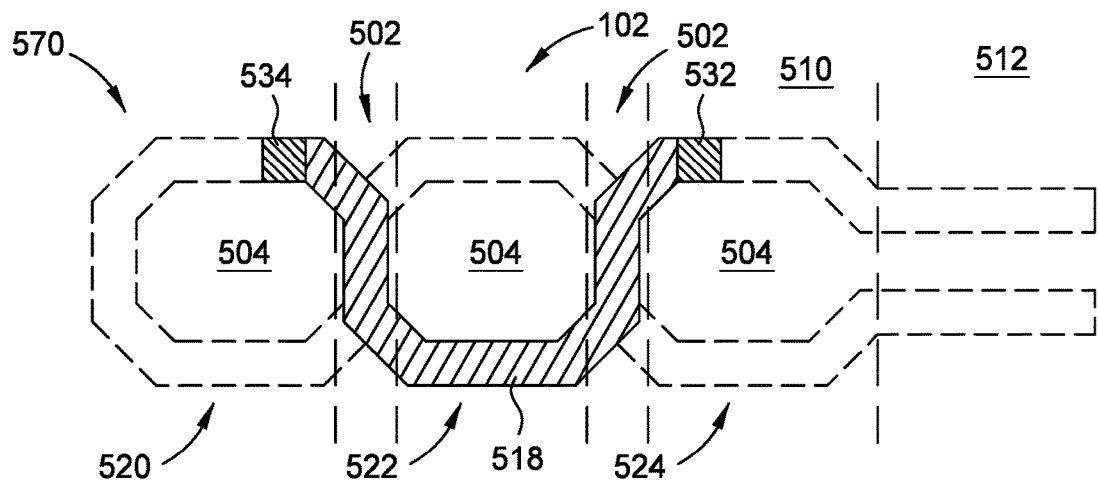

Alternative, the first inductor 102 may be formed in the patterned layers comprising the lower build-up layers 126 of the package substrate 128, as illustrated in FIGS. 5A-5C. The inductor 102 is fabricated using three layers 550, 560, 570 of the lower build-up layer 126. The first layer 550 is a patterned metal layer and is shown in FIG. 5A. The second layer 560 is a dielectric layer and is shown in FIG. 5B. The third layer 570 is a patterned metal layer and is shown in FIG. 5C. The second layer 560 separates the patterned metal layers 550, 570. It is contemplated that the first inductor 102 may have other configurations and may be fabricated in other locations within the chip package 100.

The first inductor 102 generally includes a head region 510 and a tail region 512. The tail region 512 generally includes leads 526, 528 that define the terminal ends of the first inductor 102. One lead 526 terminates at a via 506 that is coupled to the routing 312 of the first signal path 302 that extends through the core 124 of the substrate 128 and is eventually coupled to the functional circuitry 106 of the IC die 104. The other lead 528 terminates at a via 508 that is coupled to the routing 316 of the first signal path 302 that extends through the core 124 of the substrate 128 and is eventually coupled to the functional circuitry 106 of the IC die 104. The head region 510 includes loop regions 504 separated by a cross over region 502. Generally, there are N cross over regions 502 and N+1 loop regions 504, where N is a whole number greater than zero. For example, N may equal 1, 2, 5 or other suitable whole number greater than zero.

The head region 510 generally includes at least two or more connected loops (e.g., coils). In the example depicted in FIG. 5, three coils 520, 522, 524 are shown. Each coil 520, 522, 524 resides in a respective one of the loop regions 504. One or more additional coils may be connected to one of the coils 520, 522, 524. As the coils 520, 522, 524 are connected with the first and second coils 520, 522 separated from the tail region 512 by the third coil 524, the head region 510 generally has a high aspect ratio with the length of the head region 510 (in the direction of loop connections) being at least 5 times greater than the width of the head region 510 (in the perpendicular to the direction of loop connections).

On the first patterned metal layer 550, a first portion 514 of the inductor 102 is coupled to the lead 526 and second portion 516 of the first inductor 102 is coupled to the lead 528. The first and second portions 514, 516 are formed from the patterned metal comprising the patterned metal layer 550. The first portion 514 terminates prior to the first the cross over region 502 at a via 532. The via 532 passes through the second layer 560 and connects to a jumper portion 518 of the first inductor 102 residing in the second patterned metal layer 570. The jumper portion 518 forms a part of the second coil 522, and terminates at a via 534. The via 534 passes through the second layer 560 and connects to the second portion 516 of the first inductor 102 residing in the first patterned metal layer 550 within the region of the first coil 520. The second portion 516 of the first inductor 102 extends from the via 534 back to the lead 528 completing the coils 520, 522, 524 of the first inductor 102. Although not shown, the first inductor 102 may also be surrounded by a shield formed around the head region 510 and/or on another layer of the build-up layer 126.

Figure 6:
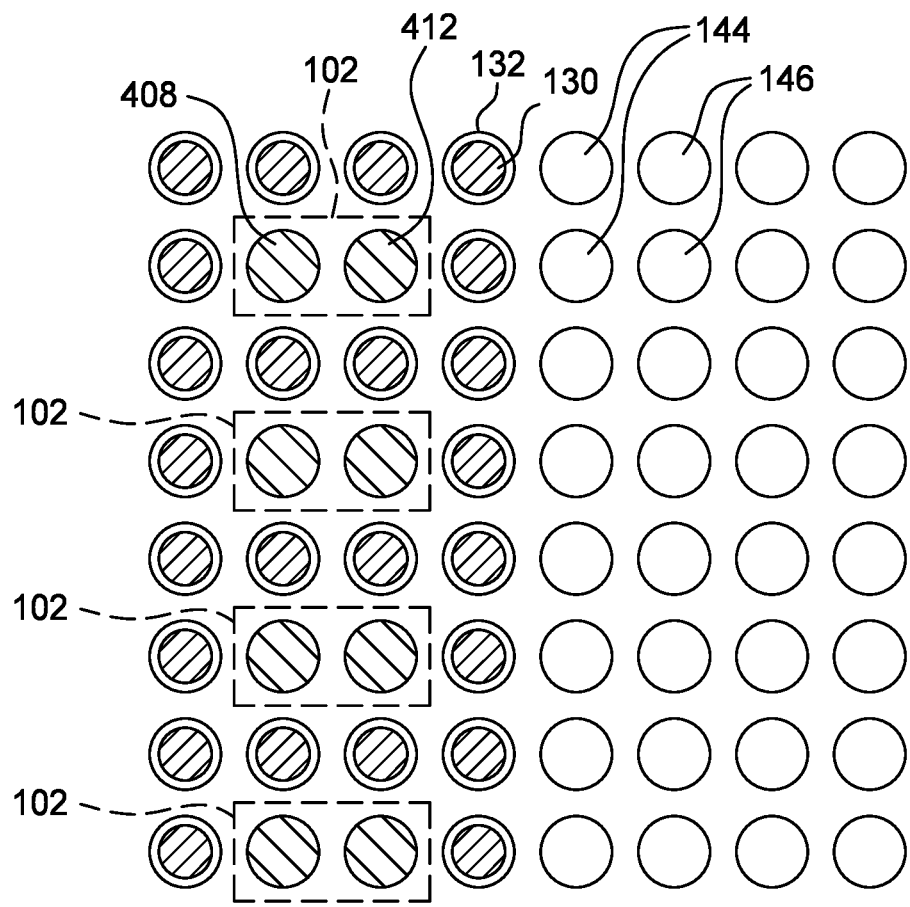
FIG. 6 is schematic partial sectional view of a portion of core of a substrate illustrating an array of inductor-coupled vias surrounded by embedded passive devices.

FIG. 6 is schematic partial sectional view of a portion of core 124 of a substrate 128 illustrating an array of inductor-coupled vias 408, 412 surrounded by integrated passive devices 130 embedded in the core 124. As illustrated in FIG. 6, vias 408, 412 of the first inductor 102 are shown passing through the core 124. The via 408 of the first inductor 102 is separated from the neighboring vias 144 by one of the integrated passive devices 130, such that the integrated passive device 130 shields the signal, such as data, power or ground, from noise present in the via 408 of the first inductor 102. The other via 412 of the first inductor 102 is also separated from the neighboring vias 144 by one of the integrated passive devices 130.

Additionally illustrated in FIG. 6 is that an array of inductor-coupled vias 408, 412 forming a plurality of inductors 102 are shielded from the neighboring data carrying vias 144 by a wall of integrated passive devices 130. Optionally, the integrated passive devices 130 may also be utilized to isolate at least two neighboring inductors 102.

Thus, chip packages have been described that includes integrated passive devices embedded in a core of a substrate of the chip package, such as a package substrate or an interposer, that shield routings coupled to inductors from adjacent through-substrate conductive paths (e.g., vias). The embedded integrated passive devices, particularly in the form of capacitors, provide excellent shielding functionality that prevents noise from being transmitted between adjacent conductors within the core of the substrate. When used to shield vias coupled to inductors, the "keep-out" space need around inductor-coupled vias may be reduced, beneficially increasing via density of the substrate. Moreover, embedded integrated passive capacitors when coupled to the inductor-coupled vias used for package integrated voltage-regular systems, increasing device performance while also reducing the area needed to route power through the substrate. Thus, use of core embedded capacitors and inductors additionally opens up extra room for power routing, achieves larger inductances within a small footprint, achieves high Q-value for high performance designs, frees up more thick metal layers on the top die for fabric power delivery network (PDN) to reduce ohmic loss.

While the foregoing is directed to embodiments of the present invention, other and further embodiments of the invention may be devised without departing from the basic scope thereof, and the scope thereof is determined by the claims that follow.

What is claimed is:

1. A chip package comprising:
   an integrated circuit (IC) die having functional circuitry;
   a substrate having the IC die mounted thereon, the substrate comprising:
   a core having a plurality of inductor routing vias, a plurality of signal transmission vias; and a plurality of ground and power routing vias; and
   upper build-up layers disposed on the core, the upper build-up layers including circuitry coupling the inductor routing vias, the signal transmission vias, and the ground and power routing vias to the functional circuitry of the IC die; and
   a first integrated passive device (IPD) disposed in the core and separating at least one of the plurality of inductor routing vias from an adjacent via, the adjacent via being one of the plurality of signal transmission vias or one of the plurality of ground and power routing vias.

2. The chip package of claim 1, wherein the first IPD is capacitor.

3. The chip package of claim 2, wherein the functional circuitry includes voltage regulator circuitry that is coupled to the first IPD and at least one of the inductor routing vias.

4. The chip package of claim 3 further comprising:
   a surface mounted decoupling capacitor coupled to the voltage regulator circuitry, the surface mounted decoupling capacitor and the first IPD are coupled to a common input of the voltage regulator circuitry.

5. The chip package of claim 4, wherein a capacitance of the first IPD is less than a capacitance of the surface mounted decoupling capacitor.

6. The chip package of claim 1, wherein a first inductor routing via of the plurality of inductor routing vias is adjacent the first IPD.

7. The chip package of claim 6, wherein the first inductor routing via is coupled to an inductor formed on a side of the core opposite the upper build-up layers.

8. The chip package of claim 6, wherein the first inductor is formed in lower built-up layers formed on a side of the core opposite the upper build-up layers.

9. The chip package of claim 6, wherein the first inductor routing via is part of an air core inductor formed in the core of the substrate.

10. A chip package comprising:
    an integrated circuit (IC) die having functional circuitry, the functional circuitry including voltage regulator circuitry;
    a substrate having the IC die mounted thereon, the substrate comprising:
    a core having a plurality of inductor routing vias including first and second inductor routing vias, a plurality of signal transmission vias; and a plurality of ground and power routing vias; and
    upper build-up layers disposed on the core, the upper build-up layers including circuitry coupling the inductor routing vias, the signal transmission vias, and the ground and power routing vias to the functional circuitry of the IC die;
    a first integrated passive device (IPD) disposed in the core adjacent least a first inductor routing via of the plurality of inductor routing vias; and
    a second IPD disposed in the core in the core adjacent least a second inductor routing via of the plurality of inductor routing vias, at least one of the first or second IPD separating at least one of the first or second inductor routing vias from an adjacent via and coupled to the voltage regulator circuitry, the adjacent via being one of the plurality of signal transmission vias or one of the plurality of ground and power routing vias.

11. The chip package of claim 10, wherein the first and second IPDs are capacitors.

12. The chip package of claim 10, wherein the first and second inductor routing vias are part of a common inductor circuit that is coupled to the voltage regulator circuitry.

13. The chip package of claim 12, wherein the functional circuitry includes voltage regulator circuitry that is coupled to the first IPD is capacitor and at least one of the inductor routing vias.

14. The chip package of claim 13 further comprising:
    a surface mounted decoupling capacitor coupled to the voltage regulator circuitry, the surface mounted decoupling capacitor and the first IPD coupled to a common input of the voltage regulator circuitry.

15. The chip package of claim 14, wherein a capacitance of the first IPD is less than a capacitance of the surface mounted decoupling capacitor.

16. The chip package of claim 15, wherein the first and second inductor routing vias form portions of a coil of an air core inductor-coupled to the first IPD and the voltage regulator circuitry.

17. The chip package of claim 15, wherein the first and second inductor routing vias are coupled to an inductor disposed on a side of the substrate opposite the IC die.

18. A chip package comprising:
    an integrated circuit (IC) die having functional circuitry, the functional circuitry including voltage regulator circuitry;
    a substrate having the IC die mounted thereon, the substrate comprising:
    a core having a plurality of inductor routing vias, a plurality of signal transmission vias; and a plurality of ground and power routing vias, the plurality of inductor routing vias including first and second inductor routing vias; and
    upper build-up layers disposed on the core, the upper build-up layers including circuitry coupling the inductor routing vias, the signal transmission vias, and the ground and power routing vias to the functional circuitry of the IC die;
    an air core inductor formed in the core of the substrate, the air core inductor coupled to the voltage regulator circuitry, the air core inductor formed in part by the first and second inductor routing vias;
    a first integrated passive device (IPD) configured as a capacitor and disposed in the core; and
    a second IPD configured as a capacitor and disposed in the core, at least one of the first and second IPDs coupled to the air core inductor and separating at least one of the first and second inductor routing vias from an adjacent via, the adjacent via being one of the plurality of signal transmission vias.

19. The chip package of claim 18, wherein the air core inductor and at least one of the first and second IPDs are coupled to a common input of the voltage regulator circuitry.

20. The chip package of claim 19 further comprising:
    a surface mounted decoupling capacitor coupled to the voltage regulator circuitry, the surface mounted decoupling capacitor coupled to the same common input of the voltage regulator circuitry as the air core inductor, the surface mounted decoupling capacitor having a capacitance greater than a capacitance of the first or second IPD.

* * * * *